(12) United States Patent
Yuasa

(10) Patent No.: US 7,303,928 B2
(45) Date of Patent: Dec. 4, 2007

(54) PROCESS MONITOR AND SYSTEM FOR PRODUCING SEMICONDUCTOR

(75) Inventor: Mitsuhiro Yuasa, Minato-Ku (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/532,991

(22) PCT Filed: Sep. 30, 2003

(86) PCT No.: PCT/JP03/12555

§ 371 (c)(1),
(2), (4) Date: Apr. 28, 2005

(87) PCT Pub. No.: WO2004/040634

PCT Pub. Date: May 13, 2004

(65) Prior Publication Data

US 2006/0008951 A1    Jan. 12, 2006

(30) Foreign Application Priority Data

Oct. 31, 2002    (JP)    ............... 2002-318116

(51) Int. Cl.
*H01L 21/00* (2006.01)
*H01L 21/66* (2006.01)
*G01R 31/26* (2006.01)

(52) U.S. Cl. .................. 438/7; 438/5; 438/14; 438/16; 257/E21.521

(58) Field of Classification Search .............. 438/5–10, 438/14, 17; 700/204
See application file for complete search history.

(56) References Cited

U.S. PATENT DOCUMENTS

| 5,444,637 | A | * | 8/1995 | Smesny et al. | ............. 702/127 |
| 6,102,284 | A | * | 8/2000 | Myers et al. | ............... 235/375 |
| 6,288,561 | B1 | * | 9/2001 | Leedy | ........................ 324/760 |
| 6,576,922 | B1 | * | 6/2003 | Ma et al. | ........................ 257/48 |
| 6,607,965 | B2 | * | 8/2003 | Moradi et al. | ............... 438/398 |
| 6,614,051 | B1 | * | 9/2003 | Ma | ............... 257/48 |
| 6,773,158 | B2 |   | 8/2004 | Koshimizu |  |
| 2004/0007326 | A1 | * | 1/2004 | Roche et al. | ........... 156/345.24 |

FOREIGN PATENT DOCUMENTS

| JP | 06-76193 | 3/1994 |
| JP | 2001-242014 | 9/2001 |
| JP | 2002-170925 | 6/2002 |
| WO | WO 00/68986 | 11/2000 |

* cited by examiner

*Primary Examiner*—Michael Lebentritt
*Assistant Examiner*—Angel Roman
(74) *Attorney, Agent, or Firm*—Crowell & Moring LLP

(57) ABSTRACT

A sensor on a semiconductor wafer is used as a process monitor and a capacitor is employed as a power supply for the sensor. The capacitor can be formed by stacking a poly-silicon layer and a silicon nitride layer on the wafer. A timer can be used to specify an operation time or an operation timing, etc. Furthermore, unauthorized use is prevented by storing a keyword in an ROM of the process monitor.

11 Claims, 2 Drawing Sheets

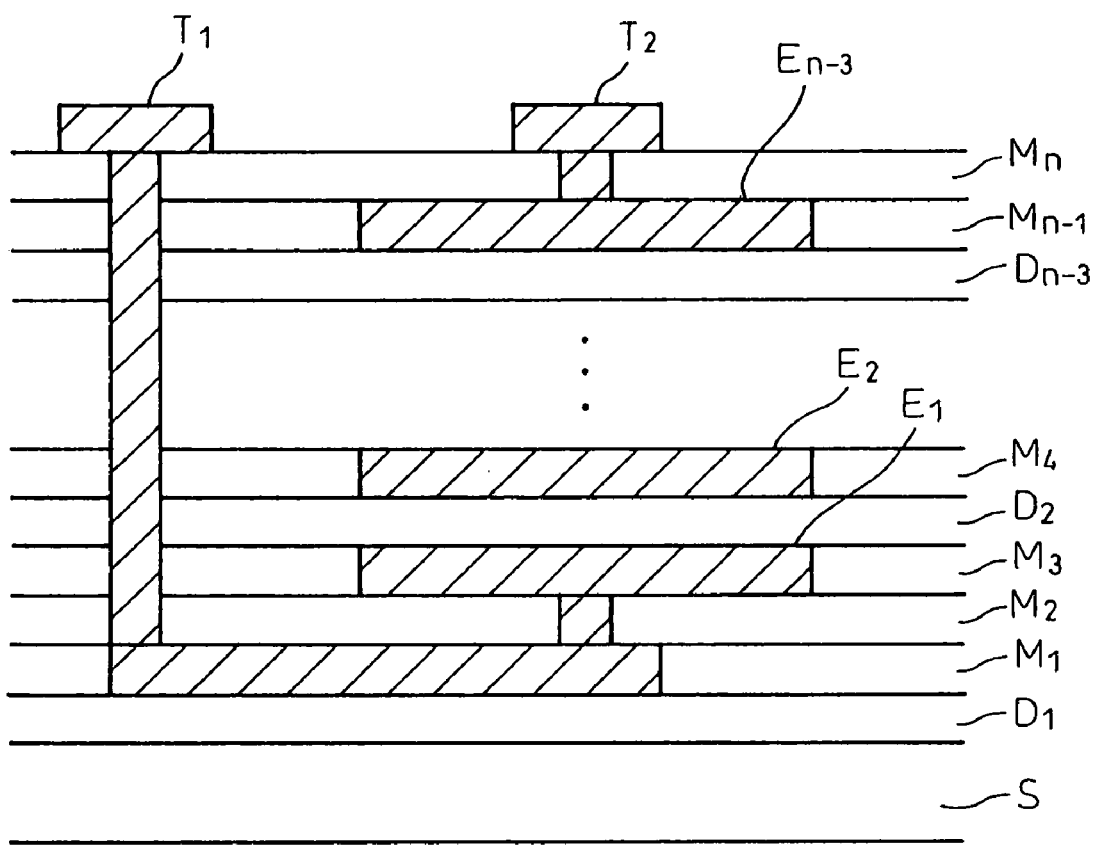

PROCESS MONITOR AND SYSTEM FOR PRODUCING SEMICONDUCTOR

FIELD OF THE INVENTION

The present invention relates to a process monitor for monitoring a semiconductor manufacturing process, such as a plasma process, and to a semiconductor manufacturing apparatus having a process monitor.

PRIOR ART

Conventionally, in a semiconductor manufacturing apparatus, a measurement of a plasma density or a temperature, etc., to optimally control a plasma process is carried out, for example, by inserting a plasma probe or a thermocouple into a plasma processing chamber at a time of development in a factory. However, as high-mix low-volume manufacture increases in LSI manufacturing, process conditions are made different and the plasma state must be measured each time the process changes. If, at each time, measuring by inserting a probe or the like is carried out, the measurement is very troublesome and a wiring, for measurement and control is necessary, which causes a disturbance in a measuring object. A simultaneous multipoint measurement is difficult and measurement at an area where the measurement is actually required is also difficult. Furthermore, a problem of contamination or a problem of decrease in operating rates, arises.

Recently, a sensor wafer, which is a sensor having no probe and can be carried in the same way as a normal silicon wafer, has been developed (see, for example, Yan Tran, Tim Yen and Bruce Bunn (UCLA) "Development of Lithium Batteries for Powering Sensor Arrays", SFR Work shop, Nov. 14, 2001).

However, a battery, which is a power supply source for the wafer sensor, is deteriorated by repeated charging and discharging. A material of which the battery is made could contaminate a plasma processing chamber if the sensor wafer is broken by an unexpected accident or the like.

DISCLOSURE OF THE INVENTION

The object of this invention, in view of the above-mentioned problems, is to provide a process monitor having a battery, which is hardly deteriorated and has no fear of contamination, and a semiconductor manufacturing apparatus having the process monitor.

To accomplish the object, a capacitor is employed as a power source of the process monitor for monitoring the process by a sensor wafer. A capacitor is not deteriorated by repeating charging and discharging as long as an insulating film does not change its nature. A material, which does not contaminate a process chamber, can be selected as material which constitutes the capacitor. For example, the capacitor can be made by stacking a poly-silicon layer and a silicon nitride layer.

The process monitor according to the present invention can comprise a memory to store measured data and further an timer to set an operating time and an operating period of the process monitor in order to make it work in specific state.

Furthermore, an unauthorized use can be prevented by storing a keyword in an Read Only Memory (ROM) of the process monitor.

A semiconductor manufacturing apparatus according to the present invention having the process monitor, comprises at least one of a housing unit to store the process monitor, a charger to charge a capacitor, that is a power supply and a reader/writer for measured data.

Moreover, semiconductor manufacturing apparatus according to the present invention can compare the measured data read by the reader/writer with predetermined reference data and can control the manufacturing process in a predetermined way, if the measured data exceeds a predetermined range of the reference data.

The process monitor according to the present invention uses a capacitor as a power source. The capacitor can be hardly deteriorated and, therefore, there is no fear of contaminating a process chamber. Further, data for only a specific period of time can be obtained by using a timer. Further, unauthorized use can be prevented because a keyword is checked when reading data. The semiconductor manufacturing apparatus according to the present invention uses the process monitor to monitor the manufacturing process without fear of contamination or decrease in operating rates and indicates appropriate maintainance for the apparatus.

BRIEF DESCRIPTION OF THE DRAWINGS

FIG. 3 is a view of one embodiment of a capacitor as a battery of a process monitor according to the present invention.

BEST MODE FOR CARRYING OUT THE INVENTION

Embodiments of this invention will be explained with reference to the drawings.

Figure 1:
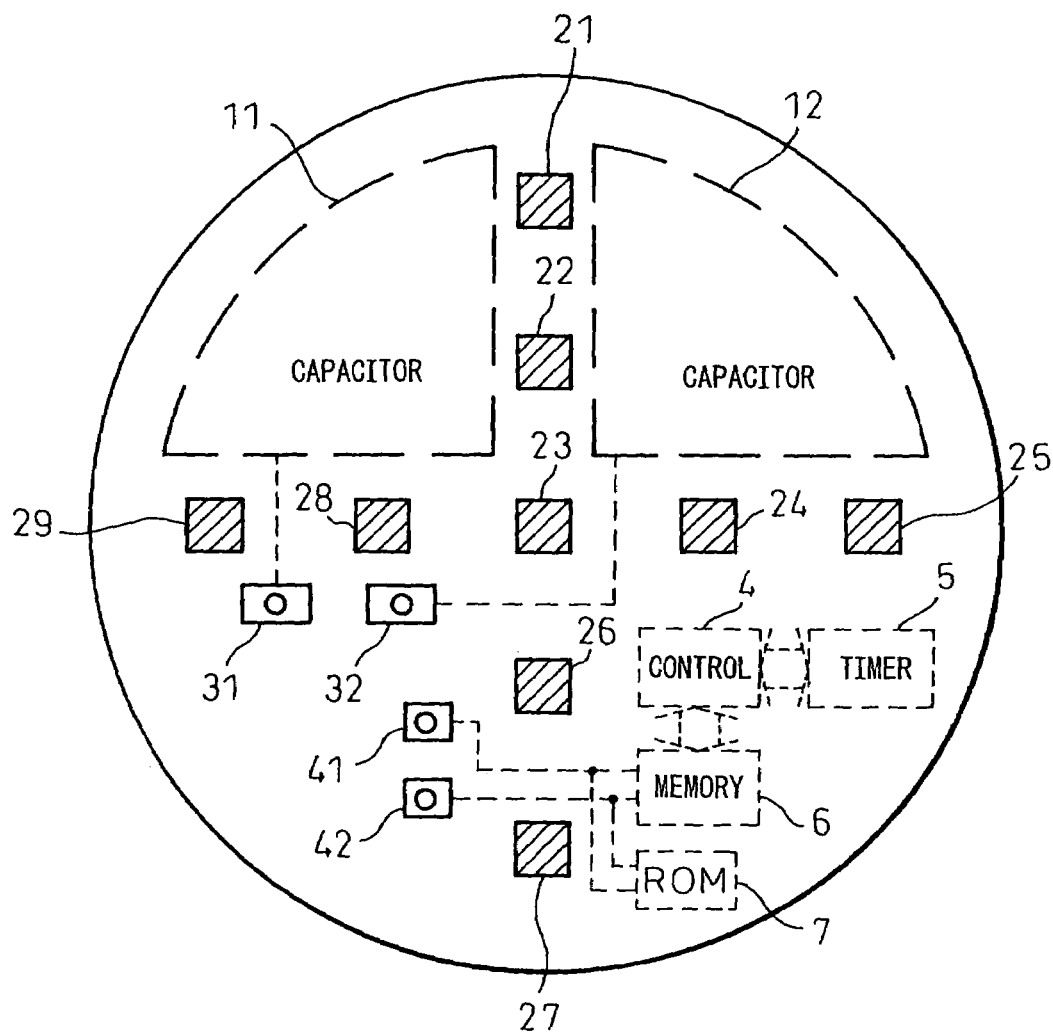
FIG. 1 is a schematic view of a process monitor according to the present invention.

FIG. 1 is a schematic view of a process monitor according to an embodiment of this invention. The process monitor, in FIG. 1, is provided with nine sensors 21 to 29 each 10 mm square, arranged crosswise on a surface of a semiconductor wafer 1 having a diameter of, for example, 300 mm. In this embodiment, multilayer capacitors 11 and 12, which are connected in series to serve as a power source, are arranged at two places of the wafer 1 and are used as a power source for measurement by the sensors and reading the measured signals. The capacitors are charged and discharged through the charging and discharging terminals 31 and 32 connected with positive and negative electrodes of the capacitors. Whether the capacitors are connected in series or in parallel can be appropriately determined, in accordance with required capacity, withstand voltage or the like.

Furthermore, a timer 5 and a controller 4 are provided. The timer 5 can specify a starting and ending time of the measurement or a time period of the measurement. The controller 4 can control the measurement by using the sensor. Further, the controller 4 can control the writing or reading action of the measured signals into or from a storage device and transmission or receipt of signals to or from an external device.

Moreover, a memory 6, which is to store the measured data, and an ROM 7 are arranged as memory devices. Data, representing the plasma state detected by the sensors 21 to 29, is stored in the data memory 6. Data signals can be taken to an external device through I/O terminals 41 and 42. In the ROM 7, keywords or passwords to identify the process monitor are stored.

Figure 2:
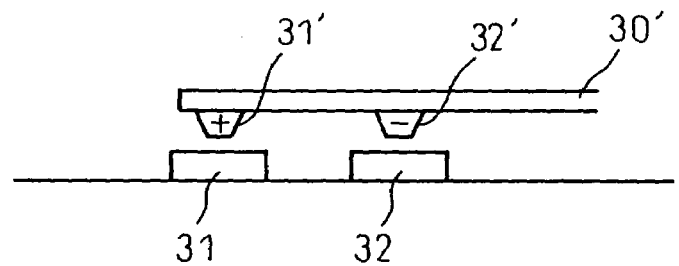
FIG. 2 is a view of one embodiment of a charging means for a process monitor according to the present invention.

FIG. 2 shows a charging operation of the capacitor of the process monitor by way of example. A three dimension movable component 30' having terminals 31' and 32', corresponding to the charging and discharging terminals 31 and 32 of the capacitor, respectively, is arranged in a charging unit provided, for example, in a cassette chamber. Charging is carried out when connection to the terminals is established. Likewise, the I/O terminals 41 and 42 are connected to terminals of a component provided in a data reading unit to obtain data signals.

FIG. 3 shows an example of the capacitor that works as a power supply in this embodiment. Although the capacitors are arranged at two places of the wafer in FIG. 1, it is assumed that one capacitor is arranged in FIG. 3.

The capacitor is fabricated on a substrate S of a Si wafer by micro-machining. Semiconductor circuits for the measuring operations and signal transmission and receipt, such as a measurement control IC, memories for measured data (SRAM, DRAM, EEPROM or the like) and other circuits required for the process monitor, not shown in the drawings, are integrated on the substrate S.

On the substrate S, insulating layers $D_1$ to $D_{n-2}$ and wiring layers $M_1$ to $M_2$ are formed and the capacitor is formed by dielectric layers $D_2$ to $D_{n-3}$ placed between electrodes $E_1$ to $E_{n-3}$ formed on wiring layers $M_3$ to $M_{n-1}$. The electrodes $E_1$ to $E_{n-3}$ are made of poly-silicon, and the dielectric layers $D_2$ to $D_{n-3}$ are made of silicon nitride. Terminals $T_1$ and $T_2$ correspond to the charging and discharging terminals 31 and 32 in FIG. 1. The terminal $T_1$ is connected to the electrode $M_3$ formed on the wiring layer $M_3$ through a via hole extending through the wiring layers. The terminal $T_2$ is connected to the electrode $E_{n-3}$ formed on the wiring layer $M_{n-1}$. The terminals $T_1$ and $T_2$ can be made of Al or can be made of poly-silicon. If used for a sensor for an etching process of Si, the terminals may be made of a material such as Ti or W. Although the number of the multi-layers constituting the capacitor can be determined appropriately, the number is usually in the range of 10 to 100 layers.

Any known method can be used to manufacture a capacitor by micro-machining. In this embodiment, conductors of the wiring layer M are made with Al. Al is applied to a front surface and is thereafter removed by etching, etc., and an insulating layer is buried in the removed portion. Although other wiring, which connects the upper and lower layers electrically, is established through via holes made with W, materials other than W can be used. Other proper materials can be also used for the electrodes and the dielectric constituting the capacitor. The capacitor can be various in form. It is also possible to form the portions constituting the capacitor separate from other components, so that only the capacitor is formed by a multi-layer structure.

Next, operations to monitor the plasma processes in the semiconductor manufacturing apparatus having the process monitor according to an embodiment of the present invention, will be explained.

Although any type of known semiconductor manufacturing apparatus can be used, an apparatus will be explained by way of example. The apparatus has, besides the plasma processing chamber, a cassette chamber, an alignment chamber and a transfer robot chamber, in which a wafer to be processed is placed in the cassette chamber, carried from the cassette chamber through the alignment chamber to the plasma processing chamber, carried back to the cassette chamber after processing.

The process monitor, that is a sensor wafer, is stored in the cassette chamber of the semiconductor manufacturing apparatus. The cassette chamber is provided with a charging unit to charge the capacitor as a power supply of the sensor wafer and with a reading unit to read measured data. If it is necessary to measure the plasma conditions of the process chamber, for example, before a lot production begins, in the same way as transfer of a normal wafer from the cassette chamber, the process monitor, which has been charged and is ready to measure, is taken out by a transfer robot, carried, introduced into the process chamber, placed on a susceptor and then the measuring process is carried out. The operation of the sensor is per se known and a plasma density and a plasma temperature, etc., are measured according to a predetermined measuring process. As a measuring time is usually in the range of 1 to 30 minutes, the operation can be performed using the power from the capacitor on the semiconductor wafer.

The sensor wafer of the embodiment has also a timer, which makes it possible to select a specific measuring time such as starting time, intermediate time or ending time. This means that data for a specific period of time, not averaged data over the whole process period, can be obtained. This is very useful, because, for example, in a process, in which an element is damaged due to instability of the plasma upon plasma ignition, the data only at the plasma ignition can be obtained.

Note that a chamber where the sensor wafer is stored and charging is carried out, is not limited to the cassette chamber. The transfer robot chamber or the alignment chamber can be used for that purpose or a chamber only for the sensor wafer can be provided. Further, a timer can be set when charging the capacitor.

In some cases, the sensor wafer may be placed on the wafer cassette together with a normal wafer to be processed, and is removed after the plasma process ends.

After measurement, the sensor wafer is returned to the cassette chamber and, if necessary, is connected to an external power supply through the charging and discharging terminals 31 and 32. Data stored in the memory 6 is read through the I/O terminals 41 and 42. In case of reading the data, the reading operation cannot be carried out unless a specific keyword or password stored in the ROM 7 of the sensor wafer can be read by the data reading unit. This prevents an unauthorized use of the sensor wafer.

A control unit to change the manufacturing conditions or to require maintenance, based on the measured data, can be provided. Namely, a database, which contains data being previously obtained and evaluated regarding the plasma, is provided in the semiconductor manufacturing apparatus or an external server. The measured data, read from the sensor wafer by the control unit, is compared with data from the database in the semiconductor manufacturing apparatus or the external server connected thereto by means of communication.

If a comparison result between the data in the database and measured data exceeds the range of a reference, the control unit can change the operation condition of the semiconductor manufacturing apparatus or transmit a signal to stop the apparatus and request maintenance. In any case, it is possible to prevent a product yield from decreasing. Further, if the sensor wafer is used without an authorization, no measured data to be compared can be obtained. Alternatively, the reading unit can transmit dummy data for the measured data.

In this embodiment, transmission and receipt of signals, the charging or the like is carried out through the I/O terminals or the charging and discharging terminals, respectively. However, signals can be transmitted or received through wireless or infrared rays and the power can be supplied to the capacitor using a contactless technique.

The invention claimed is:

1. A process monitor for monitoring a process in a process chamber by a sensor wafer having a sensor formed on a semiconductor wafer, comprising a capacitor on the sensor wafer as a power supply, a memory to store measured data obtained by the monitoring and a ROM operatively configured for storing a keyword that authorizes a read of the measured data, wherein the capacitor is made with material that does not contaminate the process chamber.

2. A process monitor according to claim 1, further comprising a timer which is used to specify a measuring time and a measuring period.

3. A process monitor according to claim 1, wherein said capacitor is formed by stacking a poly-silicon layer and a silicon nitride layer on said semiconductor wafer.

4. A semiconductor manufacturing apparatus having the process monitor of claim 1, comprising a process monitor housing unit to store said process monitor.

5. A semiconductor manufacturing apparatus having the process monitor of claim 1, comprising a charging unit to charge said capacitor, which is the power supply of the process monitor.

6. A semiconductor manufacturing apparatus having the process monitor of claim 1, comprising a reader/writer to read and write the measured data stored in said memory.

7. A semiconductor manufacturing apparatus according to claim 6, comprising a control unit which compares the measured data read by said reader/writer with predetermined reference data and controls the manufacturing process in predetermined way, if the measured data exceeds a predetermined range of the reference data.

8. A process monitor according to claim 1, further comprising a controller.

9. A process monitor for monitoring a process in a process chamber by a sensor wafer having a sensor formed on a semiconductor wafer, comprising a pair of capacitors on the sensor wafer as a power supply, a memory to store measured data obtained by the monitoring and a ROM operatively configured for storing a keyword that authorizes a read of the measured data, wherein the capacitors are made with material that does not contaminate the process chamber.

10. A process monitor according to claim 9, wherein the capacitors are connected in series.

11. A process monitor according to claim 9, wherein the capacitors are connected in parallel.

* * * * *